(12) United States Patent
Kalavade et al.

(10) Patent No.: US 11,315,644 B2
(45) Date of Patent: Apr. 26, 2022

(54) STRING CURRENT REDUCTION DURING MULTISTROBE SENSING TO REDUCE READ DISTURB

(71) Applicant: Intel Corporation, Santa Clara, CA (US)

(72) Inventors: Pranav Kalavade, San Jose, CA (US); Rohit S. Shenoy, Fremont, CA (US); Golnaz Karbasian, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 46 days.

(21) Appl. No.: 17/032,791

(22) Filed: Sep. 25, 2020

(65) Prior Publication Data

US 2022/0101932 A1    Mar. 31, 2022

(51) Int. Cl.
| | |
|---|---|
| *G11C 11/34* | (2006.01) |
| *G11C 16/34* | (2006.01) |
| *G11C 11/56* | (2006.01) |
| *G11C 16/26* | (2006.01) |
| *G11C 16/04* | (2006.01) |

(52) U.S. Cl.
CPC ...... *G11C 16/3427* (2013.01); *G11C 11/5642* (2013.01); *G11C 11/5671* (2013.01); *G11C 16/0483* (2013.01); *G11C 16/26* (2013.01)

(58) Field of Classification Search
CPC ......... G11C 16/10; G11C 16/30; G11C 16/12; G11C 16/0483; H01L 27/115
USPC ...................................................... 365/185.18
See application file for complete search history.

(56) References Cited

U.S. PATENT DOCUMENTS

| | | | |
|---|---|---|---|
| 9,529,663 B1 * | 12/2016 | Srinivasan ......... | G11C 29/4401 |
| 2011/0273935 A1 * | 11/2011 | Dong .................. | G11C 11/5642 |
| | | | 365/185.22 |

\* cited by examiner

*Primary Examiner* — Son T Dinh
(74) *Attorney, Agent, or Firm* — Alliance IP, LLC

(57) ABSTRACT

A memory device comprising a memory array; and controller circuitry to apply a first pass voltage to a first plurality of unselected wordlines of the memory array during a string current sensing phase; and reduce the first pass voltage applied to the first plurality of unselected wordlines during a multistrobe sensing phase that follows the string current sensing phase.

20 Claims, 7 Drawing Sheets

US 11,315,644 B2

STRING CURRENT REDUCTION DURING MULTISTROBE SENSING TO REDUCE READ DISTURB

BACKGROUND

A computer system may include one or more central processing units (CPUs) which may communicate with one or more storage devices. A CPU may include a processor to execute an operating system and/or other software applications that utilize a storage device coupled to the CPU. The software applications may write data to and read data from the storage device.

BRIEF DESCRIPTION OF THE DRAWINGS

Like reference numbers and designations in the various drawings indicate like elements.

DETAILED DESCRIPTION

Although the drawings depict particular computer systems, the concepts of various embodiments are applicable to any suitable integrated circuits and other logic devices. Examples of devices in which teachings of the present disclosure may be used include desktop computer systems, server computer systems, storage systems, handheld devices, tablets, other thin notebooks, systems on a chip (SOC) devices, and embedded applications. Some examples of handheld devices include cellular phones, digital cameras, media players, personal digital assistants (PDAs), and handheld PCs. Embedded applications may include, e.g., a microcontroller, a digital signal processor (DSP), an SOC, a network computer (NetPC), a set-top box, a network hub, a wide area network (WAN) switch, or any other system that can perform the functions and operations taught below. Various embodiments of the present disclosure may be used in any suitable computing environment, such as a personal computing device, a server, a mainframe, a cloud computing service provider infrastructure, a datacenter, a communications service provider infrastructure (e.g., one or more portions of an Evolved Packet Core), or other environment comprising a group of computing devices.

Figure 1:
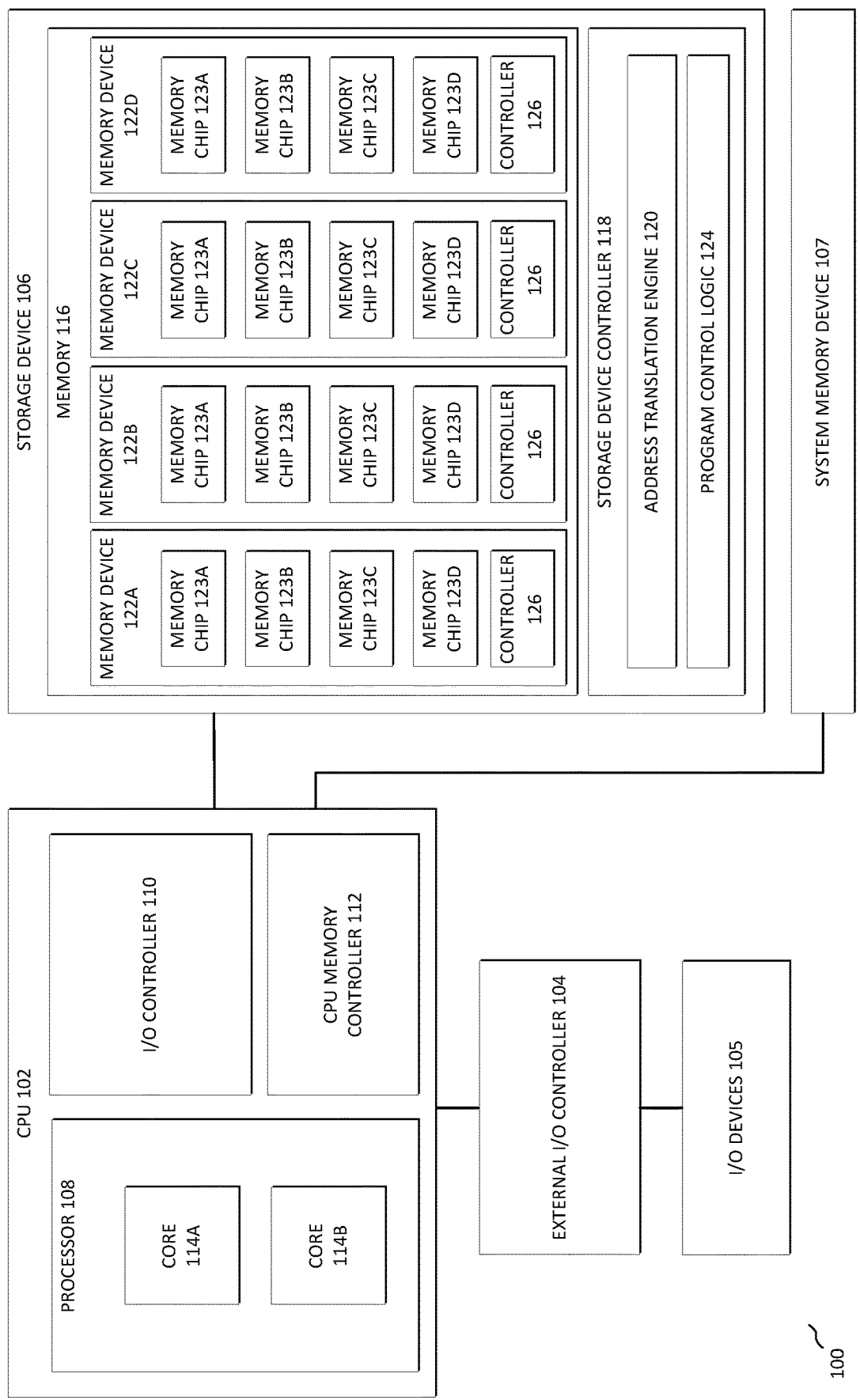
FIG. 1 illustrates a block diagram of a computer system to implement string current reduction during multistrobe sensing in accordance with certain embodiments.

FIG. 1 illustrates a block diagram of a computer system 100 to implement string current reduction during multistrobe sensing in accordance with certain embodiments. Computer system comprises a central processing unit 102 coupled to an external input/output (I/O) controller 104, I/O devices 105, storage device 106, and system memory device 107.

Any suitable component (e.g., storage device 106) of system 100 may comprise memory that utilizes a multistrobe operation. During the multistrobe operation, a value of one or more memory cells may be captured and the captured value(s) (or a reference value) may then be adjusted multiple times and sensed after each adjustment to reduce the number of errors for the read operation. Common multistrobe operations include soft bit read (SBR) and auto read calibration (ARC). In such operations, multistrobe sensing may provide fast read level optimization to minimize bit error rate and/or improved error-correcting code (ECC) performance. However, conventional multistrobe sensing increases the time that memory cells are kept at a bias high enough to provide a certain string current relative to a standard read operation. This in turn leads to increased read disturb on those cells (e.g., by changing the threshold voltage of such cells) and ultimately reduces the number of times that those cells can be read correctly before the cells need to be refreshed.

In various embodiments of the present disclosure, a reduced bias is applied to memory cells (e.g., NAND flash memory cells) during a multistrobe sensing portion of a read operation. Because no string current measurement is taking place in this step, reduction of the bias does not interfere with the read operation. The reduction in bias may decrease the stress on the cells, thus reducing the read disturb and allowing for a greater number of reads of the cell before a refresh is required.

Returning again to FIG. 1, CPU 102 comprises a processor 108, such as a microprocessor, an embedded processor, a digital signal processor (DSP), a network processor, a handheld processor, an application processor, a co-processor, an SOC, or other device to execute code (i.e., software instructions). Processor 108, in the depicted embodiment, includes two processing elements (cores 114A and 114B), which may include asymmetric processing elements or symmetric processing elements. However, a processor may include any number of processing elements that may be symmetric or asymmetric.

In one embodiment, a processing element refers to hardware or logic to support a software thread. Examples of hardware processing elements include: a thread unit, a thread slot, a thread, a process unit, a context, a context unit, a logical processor, a hardware thread, a core, and/or any other element, which is capable of holding a state for a processor, such as an execution state or architectural state. In other words, a processing element, in one embodiment, refers to any hardware capable of being independently associated with code, such as a software thread, operating system, application, or other code. A physical processor (or processor socket) typically refers to an integrated circuit, which potentially includes any number of other processing elements, such as cores or hardware threads.

A core 114 (e.g., core 114A or core 114B) may refer to logic located on an integrated circuit capable of maintaining an independent architectural state, wherein each independently maintained architectural state is associated with at least some dedicated execution resources. A hardware thread may refer to any logic located on an integrated circuit capable of maintaining an independent architectural state, wherein the independently maintained architectural states share access to execution resources. As can be seen, when certain resources are shared and others are dedicated to an architectural state, the line between the nomenclature of a hardware thread and core overlaps. Yet often, a core and a hardware thread are viewed by an operating system as individual logical processors, where the operating system is able to individually schedule operations on each logical processor.

In various embodiments, the processing elements may also include one or more arithmetic logic units (ALUs), floating point units (FPUs), caches, instruction pipelines, interrupt handling hardware, registers, or other hardware to facilitate the operations of the processing elements.

I/O controller 110 is an integrated I/O controller that includes logic for communicating data between CPU 102 and I/O devices. In other embodiments, the I/O controller 110 may be on a different chip from the CPU 102. I/O devices may refer to any suitable devices capable of transferring data to and/or receiving data from an electronic system, such as CPU 102. For example, an I/O device may comprise an audio/video (A/V) device controller such as a graphics accelerator or audio controller; a data storage device controller, such as a flash memory device, magnetic storage disk, or optical storage disk controller; a wireless transceiver; a network processor; a network interface controller; or a controller for another input devices such as a monitor, printer, mouse, keyboard, or scanner; or other suitable device. In a particular embodiment, an I/O device may comprise a storage device 106 that may be coupled to the CPU 102 through I/O controller 110.

An I/O device may communicate with the I/O controller 110 of the CPU 102 using any suitable signaling protocol, such as peripheral component interconnect (PCI), PCI Express (PCIe), Universal Serial Bus (USB), Serial Attached SCSI (SAS), Serial ATA (SATA), Fibre Channel (FC), IEEE 802.3, IEEE 802.11, or other current or future signaling protocol. In particular embodiments, I/O controller 110 and an associated I/O device may communicate data and commands in accordance with a logical device interface specification such as NVMe (e.g., as described by one or more of the specifications available at www.nvmexpress.org/specifications/) or Advanced Host Controller Interface (AHCI) (e.g., as described by one or more AHCI specifications such as Serial ATA AHCI: Specification, Rev. 1.3.1 available at http://www.intel.com/content/www/us/en/io/serial-ata/serial-ata-ahci-spec-rev1-3-1.html). In various embodiments, I/O devices coupled to the I/O controller 110 may be located off-chip (e.g., not on the same chip as CPU 102) or may be integrated on the same chip as the CPU 102.

CPU memory controller 112 is an integrated memory controller that controls the flow of data going to and from one or more system memory devices 107. CPU memory controller 112 may include logic operable to read from a system memory device 107, write to a system memory device 107, or to request other operations from a system memory device 107. In various embodiments, CPU memory controller 112 may receive write requests from cores 114 and/or I/O controller 110 and may provide data specified in these requests to a system memory device 107 for storage therein. CPU memory controller 112 may also read data from a system memory device 107 and provide the read data to I/O controller 110 or a core 114. During operation, CPU memory controller 112 may issue commands including one or more addresses of the system memory device 107 in order to read data from or write data to memory (or to perform other operations). In some embodiments, CPU memory controller 112 may be implemented on the same chip as CPU 102, whereas in other embodiments, CPU memory controller 112 may be implemented on a different chip than that of CPU 102. I/O controller 110 may perform similar operations with respect to one or more storage devices 106.

A system memory device 107 may store any suitable data, such as data used by processor 108 to provide the functionality of computer system 100. For example, data associated with programs that are executed or files accessed by cores 114 may be stored in system memory device 107. Thus, a system memory device 107 may include a system memory that stores data and/or sequences of instructions that are executed or otherwise used by the cores 114. In various embodiments, a system memory device 107 may store temporary data, persistent data (e.g., a user's files or instruction sequences) that remains stored even after power to the system memory device 107 is removed, or a combination thereof. A system memory device 107 may be dedicated to a particular CPU 102 or shared with other devices (e.g., one or more other processors or other devices) of computer system 100.

In various embodiments, a system memory device 107 may include a memory comprising any number of memory arrays, a memory device controller, and other supporting logic (not shown). A memory array may include non-volatile memory and/or volatile memory. Non-volatile memory is a storage medium that does not require power to maintain the state of data stored by the medium, thus non-volatile memory may have a determinate state even if power is interrupted to the device. Nonlimiting examples of nonvolatile memory may include any or a combination of: solid state memory (such as planar or 3D NAND flash memory or NOR flash memory), 3D crosspoint memory, memory devices that use chalcogenide phase change material (e.g., chalcogenide glass), byte addressable nonvolatile memory devices, ferroelectric memory, silicon-oxide-nitride-oxide-silicon (SONOS) memory, polymer memory (e.g., ferroelectric polymer memory), ferroelectric transistor random access memory (Fe-TRAM) ovonic memory, nanowire memory, electrically erasable programmable read-only memory (EEPROM), other various types of non-volatile random access memories (RAMs), and magnetic storage memory. In some embodiments, 3D crosspoint memory may comprise a transistor-less stackable cross point architecture in which memory cells sit at the intersection of words lines and bitlines and are individually addressable and in which bit storage is based on a change in bulk resistance.

Volatile memory is a storage medium that requires power to maintain the state of data stored by the medium (thus volatile memory is memory whose state (and therefore the data stored on it) is indeterminate if power is interrupted to the device). Dynamic volatile memory requires refreshing the data stored in the device to maintain state. One example of dynamic volatile memory includes DRAM (dynamic random access memory), or some variant such as synchronous DRAM (SDRAM). A memory subsystem as described herein may be compatible with a number of memory technologies, such as DDR3 (double data rate version 3, original release by JEDEC (Joint Electronic Device Engineering Council) on Jun. 27, 2007, currently on release 21), DDR4 (DDR version 4, JESD79-4 initial specification published in September 2012 by JEDEC), DDR4E (DDR version 4, extended, currently in discussion by JEDEC), LPDDR3 (low power DDR version 3, JESD209-3B, August 2013 by JEDEC), LPDDR4 (LOW POWER DOUBLE DATA RATE (LPDDR) version 4, JESD209-4, originally published by JEDEC in August 2014), WIO2 (Wide I/O 2 (WideIO2), JESD229-2, originally published by JEDEC in August 2014), HBM (HIGH BANDWIDTH MEMORY DRAM, JESD235, originally published by JEDEC in October 2013), DDR5 (DDR version 5, currently in discussion by JEDEC), LPDDR5, originally published by JEDEC in January 2020, HBM2 (HBM version 2), originally published by JEDEC in January 2020, or others or combinations of memory technologies, and technologies based on derivatives or extensions of such specifications.

A storage device 106 may store any suitable data, such as data used by processor 108 to provide functionality of computer system 100. For example, data associated with programs that are executed or files accessed by cores 114A and 114B may be stored in storage device 106. Thus, in some embodiments, a storage device 106 may store data and/or sequences of instructions that are executed or otherwise used by the cores 114A and 114B. In various embodiments, a storage device 106 may store persistent data (e.g., a user's files or software application code) that remains stored even after power to the storage device 106. A storage device 106 may be dedicated to CPU 102 or shared with other devices (e.g., another CPU or other device) of computer system 100.

In the embodiment depicted, storage device 106 includes a storage device controller 118 and a memory 116 comprising four memory devices 122A-D operable to store data, however, a storage device may include any suitable number of memory devices. A storage device 106 may include any number of memories 116 and each memory 116 may include any number of memory devices 122 (e.g., 122A-D). In a particular embodiment, a memory device 122 may be or comprise a semiconductor package with one or more memory chips 123 (e.g., memory chips 123A-D). In the embodiment depicted, memory 116 includes memory devices 122A-D (while specific references herein may be made to memory device 122A, the other memory devices may have any suitable characteristics of memory device 122A) and memory device controller 126.

A memory device 122A includes a plurality of memory cells that are each operable to store one or more bits (e.g., each memory chip of the memory device may include a plurality of memory cells). The cells of a memory device 122A may be arranged in any suitable fashion, such as in rows (e.g., wordlines) and columns (e.g., bitlines), three dimensional structures, and/or other manner. In various embodiments, the cells may be logically grouped into banks, blocks, subblocks, planes, wordlines, pages, frames, bytes, or other suitable groups.

A memory device 122A may include any of the volatile or non-volatile memories listed above or other suitable memory. In particular embodiments, memory device 122A includes non-volatile memory, such as planar or 3D NAND flash memory. In particular embodiments, a memory device 122A with non-volatile memory may comply with one or more standards for non-volatile memory promulgated by JEDEC, such as JESD218, JESD219, JESD220-1, JESD220C, JESD223C, JESD223-1, or other suitable existing or future standard (the JEDEC standards cited herein are available at www.jedec.org).

In various embodiments, a storage device 106 comprises NAND flash memory (herein a storage device comprising NAND flash memory is referred to as a NAND flash storage device). In some embodiments, storage device 106 may be a solid-state drive; a memory card; a Universal Serial Bus (USB) flash drive; or memory integrated within a device such as a smartphone, camera, media player, or other computing device. In general, storage devices with NAND flash memory are classified by the number of bits stored by each cell of the memory. For example, a single-level cell (SLC) memory has cells that each store one bit of data, a multi-level cell (MLC) memory has cells that each store two bits of data, a tri-level cell (TLC) memory has cells that each store three bits of data, a quad-level cell (QLC) memory has cells that each store four bits of data, and a penta-level cell (PLC) memory has cells that each store five bits of data, though some memories may utilize multiple encoding schemes (e.g., MLC and TLC) on the same array or on different arrays of the same device.

In a particular embodiment, a memory device 122 is embodied within a semiconductor package. In various embodiments, a semiconductor package may comprise a casing comprising one or more semiconductor dies (also referred to as chips), such as memory chips 123A-D. A package may also comprise contact pins or leads used to connect to external circuits. However, a package is merely one example form a memory device 122 may take as a memory device may be any suitable arrangement of one or more memory arrays and associated logic in any suitable physical arrangement. For example, although a single physical package may include a single memory device 122, multiple memory devices 122 could be resident on a single package or a memory device 122 could be spread across multiple packages.

A memory 116 may be embodied in one or more different physical mediums, such as a circuit board, die, disk drive, other medium, or any combination thereof (or combination with one or more packages). In a particular embodiment, memory 116 comprises a circuit board coupled to a plurality of memory devices 122 that each comprise a semiconductor package.

System memory device 107 and storage device 106 may comprise any suitable types of memory and are not limited to a particular speed, technology, or form factor of memory in various embodiments. For example, a storage device 106 may be a disk drive (such as a solid-state drive), a flash drive, memory integrated with a computing device (e.g., memory integrated on a circuit board of the computing device), a memory module (e.g., a dual in-line memory module) that may be inserted in a memory socket, or other type of storage device. Similarly, system memory 107 may have any suitable form factor. Moreover, computer system 100 may include multiple different types of storage devices.

System memory device 107 or storage device 106 may include any suitable interface to communicate with CPU memory controller 112 or I/O controller 110 using any suitable communication protocol such as a DDR-based protocol, PCI, PCIe, USB, SAS, SATA, FC, System Management Bus (SMBus), or other suitable protocol. In some embodiments, a system memory device 107 or storage device 106 may include a communication interface to communicate with CPU memory controller 112 or I/O controller 110 in accordance with any suitable logical device interface specification such as NVMe, AHCI, or other suitable specification. In particular embodiments, system memory device 107 or storage device 106 may comprise multiple communication interfaces that each communicate using a separate protocol with CPU memory controller 112 and/or I/O controller 110.

Storage device controller 118 may include logic to receive requests from CPU 102 (e.g., via an interface that communicates with CPU memory controller 112 or I/O controller 110), cause the requests to be carried out with respect to a memory 116 (or memory devices(s) and/or memory chip(s) thereof), and provide data associated with the requests to CPU 102 (e.g., via CPU memory controller 112 or I/O controller 110). Storage device controller 118 may also be operable to detect and/or correct errors encountered during memory operation. In an embodiment, controller 118 also tracks the number of times particular cells (or logical groupings of cells) have been written to in order to perform wear leveling and/or to detect when cells are nearing an estimated number of times they may be reliably written to. In performing wear leveling, the storage device controller 118 may evenly spread out write operations among blocks of the memory of a memory 116 such that particular blocks are not written to more than other blocks. In various embodiments, controller 118 may also monitor various characteristics of the storage device 106 such as the temperature or voltage and report associated statistics to the CPU 102. Storage device controller 118 can be implemented on the same circuit board or device as a memory 116 or on a different circuit board, or device. For example, in some environments, storage device controller 118 may be a centralized storage controller that manages memory operations for multiple different memories 116 (which may each be of the same type of memory or may be of different types) of computer system 100 (and thus may provide storage device controller functionality described herein to any of the memories to which it is coupled).

In various embodiments, the storage device 106 also includes an address translation engine 120. In the depicted embodiment, the address translation engine 120 is shown as part of the storage device controller 118, although in various embodiments, the address translation engine 120 may be separate from the storage device controller 118 and communicably coupled to the storage device controller 118. In various embodiments, the address translation engine 120 may be integrated on the same chip or package as the storage device controller 118 or on a different chip or package.

In various embodiments, address translation engine 120 may include logic to store and update a mapping between a logical address space (e.g., an address space visible to a host computing device coupled to the storage device 106) and the physical address space of the memory 116 of the storage device 106 (which may or may not be exposed to the host computing device). The logical address space may expose a plurality of logical groups of data which are physically stored on corresponding physical groups of memory addressable through the physical address space of the storage device 106. A physical address of the physical address space may comprise any suitable information identifying a physical memory location (e.g., a location within a memory array of a memory 116) of the storage device 106, such as an identifier of the memory 116 on which the physical memory location is located, an identifier of the memory device 122A on which the physical memory location is located, one or more pages of the physical memory location, one or more subblocks of the physical memory location, one or more wordlines of the physical memory location, one or more bitlines of the physical memory location, or other suitable identifiers or encodings thereof.

In various embodiments, the storage device 106 also includes program control logic 124 which alone or in combination with a controller 126 of a memory device 122 is operable to control the programming sequence performed when data is written to a memory 116, the read sequence performed when data is read from a memory 116, or an erase sequence when data is erased from a memory 116. In various embodiments, program control logic 124 may provide the various voltages (or information indicating which voltages should be provided) that are applied to one or more memory cells, wordlines, bitlines, and/or other portions of a memory array during the programming, reading, and/or erasing of data, perform error correction, and perform other suitable functions.

In various embodiments, the program control logic 124 may be integrated on the same chip as the storage device controller 118 or on a different chip. In the depicted embodiment, the program control logic 124 is shown as part of the storage device controller 118, although in various embodiments, all or a portion of the program control logic 124 may be separate from the storage device controller 118 and communicably coupled to the storage device controller 118. For example, all or a portion of the program control logic 124 may be located on the same package or chip as a memory 116 and/or memory devices 122A-D.

In some embodiments, all, or some of the elements of system 100 are resident on (or coupled to) the same circuit board (e.g., a motherboard). In various embodiments, any suitable partitioning between the elements may exist. For example, the elements depicted in CPU 102 may be located on a single die (i.e., on-chip) or package or any of the elements of CPU 102 may be located off-chip or off-package. Similarly, the elements depicted in storage device 106 may be located on a single chip or on multiple chips. In various embodiments, a storage device 106 and a host computing device (e.g., CPU 102) may be located on the same circuit board or on the same device and in other embodiments the storage device 106 and the host computing device may be located on different circuit boards or devices.

The components of system 100 may be coupled together in any suitable manner. For example, a bus may couple any of the components together. A bus may include any suitable interconnect, such as a multi-drop bus, a mesh interconnect, a ring interconnect, a point-to-point interconnect, a serial interconnect, a parallel bus, a coherent (e.g. cache coherent) bus, a layered protocol architecture, a differential bus, or a Gunning transceiver logic (GTL) bus. In various embodiments, an integrated I/O subsystem includes point-to-point multiplexing logic between various components of system 100, such as cores 114, memory controller 112, I/O controller 110, integrated I/O devices, direct memory access (DMA) logic (not shown), etc. In various embodiments, components of computer system 100 may be coupled together through one or more networks comprising any number of intervening network nodes, such as routers, switches, or other computing devices. For example, a host computing device (e.g., CPU 102) and the storage device 106 may be communicably coupled through a network.

Although not depicted, system 100 may use a battery and/or power supply outlet connector and associated system to receive power, a display to output data provided by CPU 102, or a network interface allowing the CPU 102 to communicate over a network. In various embodiments, the battery, power supply outlet connector, display, and/or network interface may be communicatively coupled to CPU 102. Other sources of power can be used such as renewable energy (e.g., solar power or motion based power).

Figure 7:
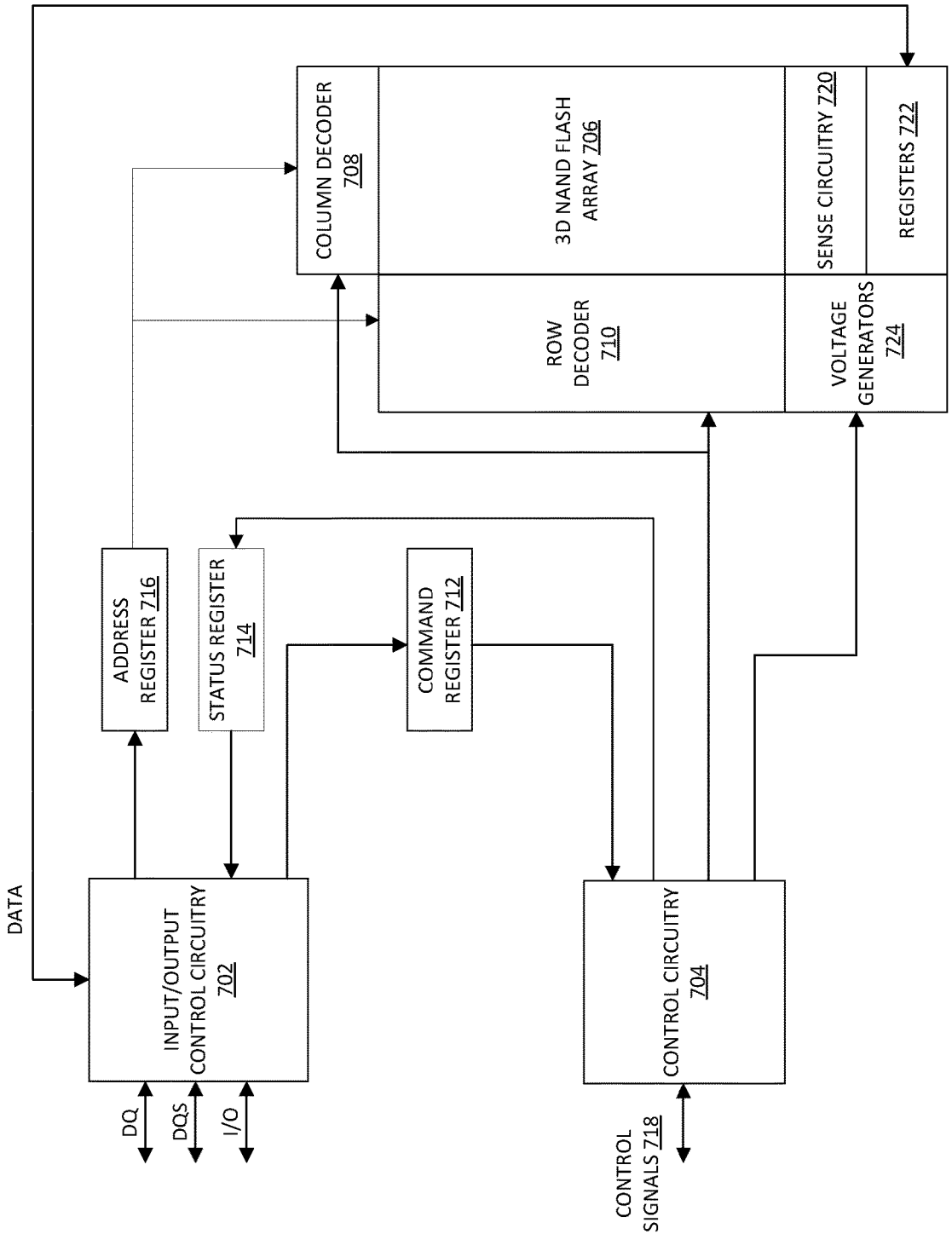
FIG. 7 is a block diagram of a three-dimensional (3D) NAND device in accordance with certain embodiments.

Referring ahead to FIG. 7, a block diagram of a three-dimensional (3D) NAND device 700 is shown. In some embodiments, 3D NAND device 700 may correspond to memory device 122. The 3D NAND device 700 includes input/output control circuitry 702 and control circuitry 704 that are coupled to a host memory controller (not shown) via a plurality of control and data signals. The 3D NAND device 700 also includes a 3D NAND Flash array 706 that includes a plurality of NAND cells organized in rows and columns.

A row decoder 710 and a column decoder 708 are provided to decode address signals to access the 3D NAND Flash array 706. The 3D NAND device 700 further includes input/output (I/O) control circuitry 702 to manage input of commands, addresses, and data to the 3D NAND device 700 and the output of data and status information from the 3D NAND device 700. An address register 716 is in communication with I/O control circuitry 702, and row decoder 710 and column decoder 708, to latch the address signals prior to decoding. A command register 712 is in communication with I/O control circuitry 702 and control circuitry 704 to latch incoming commands.

Control circuitry 704 controls access to the 3D NAND Flash array 706 in response to the commands and generates status information. Control circuitry 704 is in communication with row decoder 710 and column decoder 708 to control the row decoder 710 and column decoder 708 in response to the addresses. Additionally, control circuitry 704 can issue erase commands that trigger activation of one or more high voltage transistors within row decoder 710 and column decoder 708. In other examples, the one or more high-voltage transistors are located separately from row decoder 710 and column decoder 708, such as within the 3D NAND Flash array 706.

The Open NAND Flash Interface (ONFI) is a standard that may define the operation of the data bus and the control signals. The ONFI standard supports an 8-bit or 16-bit data bus (two independent 8-bit data buses) and up to four NAND Flash die in a package.

The input/output control circuitry 702 in the 3D NAND device 700 communicates with the host memory controller (e.g., CPU memory controller 112 via storage device controller 118) via a bidirectional data bus (DQ) and a bidirectional data strobe (DQS) signal. The DQS signal is used to indicate a data valid window. The control circuitry 704 in the 3D NAND device 700 receives control signals 718 from the host memory controller. The control signals 718 that are received include chip enable (CE #) to select the 3D NAND device 700 for data transfer with the host memory controller, Address Latch Enable (ALE) to indicate the type of bus cycle (command, address or data), Command Latch Enable (CLE) to indicate the type of bus cycle (command, address or data), Read Enable (RE #), Write Enable (WE #), and Write Protect (WP #) to disable program and erase operations. The 3D NAND device 700 also includes control signals 718 output by control circuitry 704 that include a Ready/Busy (R/B #) signal to indicate whether the 3D NAND device 700 is executing an operation ("busy") or is ready for a next operation.

The 3D NAND device 700 also includes sense circuitry 720 to sense states of targeted memory cells of 3D NAND Flash array 706 during read operations and registers 722 to store sensed values or other associated data for communication to the input/output control circuitry 702.

The 3D NAND device 700 further includes voltage generators 724 to generate various voltages that are used to access the 3D NAND Flash array 706 (e.g., to perform read or write operations). For example, voltage generators 724 may include circuitry to generate read voltages that are applied to selected wordlines and pass voltages that are applied to unselected wordlines (as explained in further detail below). Voltage generators 724 may comprise any suitable circuitry, such as charge pumps and regulators and may be controlled via signals from control circuitry 704.

It will be appreciated that the memory device of FIG. 7 may include additional circuitry and signals, and that the functional blocks of the memory device may not necessarily be segregated as shown in this example case. For example, a single component or component portion of an integrated circuit device could be adapted to perform the functionality of more than one block component of FIG. 7. Alternatively, or in addition, functionality of a single block component of FIG. 7 may be distributed into multiple blocks. Additionally, while specific I/O pins are described in accordance with popular conventions for receipt and output of the various signals, it is noted that other combinations or numbers of I/O pins may be used in the various embodiments. Many variations will be appreciated.

Figure 2:
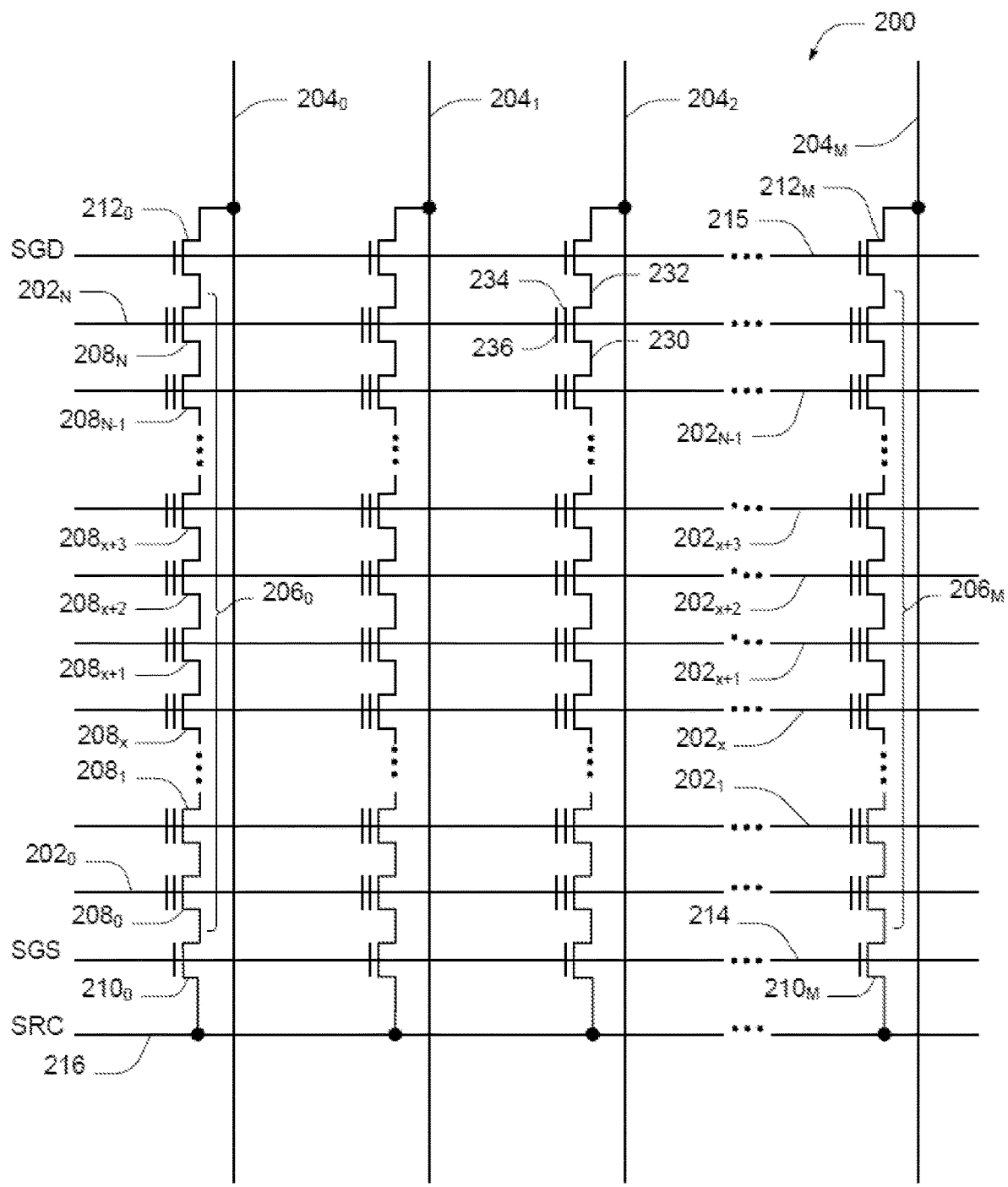
FIG. 2 illustrates an example portion of a NAND flash memory array in accordance with certain embodiments.

FIG. 2 illustrates an example portion of a NAND flash memory array 200 in accordance with certain embodiments. In various embodiments, each memory chip 123 includes an array 200 of memory cells logically arranged in rows and columns. Memory cells of a logical row are typically connected to the same access line (commonly referred to as a wordline) while memory cells of a logical column are typically selectively connected to the same data line (commonly referred to as a bitline). In some embodiments, a single access line may be associated with more than one logical row of memory cells and a single data line may be associated with more than one logical column. Memory cells of the array are capable of being programmed to one of at least two data states (i.e., program levels).

Memory array 200 includes access lines, such as wordlines $202_0$ to $202_N$, and data lines, such as bitlines $204_0$ to $204_M$. In some embodiments, the wordlines 202 may be connected to global access lines (e.g., global wordlines) in a many-to-one relationship.

Memory array 200 may be arranged in rows (each corresponding to a wordline 202) and columns (each corresponding to a bitline 204). Each column may include a string of series-connected memory cells, such as one of NAND strings $206_0$ to $206_M$. Each NAND string 206 may be connected (e.g., selectively connected) to a common source 216 and may include a plurality of memory cells. For example, NAND string $206_0$ includes memory cells $208_0$ to $208_N$. The memory cells 208 represent non-volatile memory cells for storage of data. The memory cells 208 of each NAND string 206 may be connected in series between a select transistor 210 (e.g., a field-effect transistor), such as one of the select transistors $210_0$ to $210_M$ (e.g., that may each be a source select transistor, commonly referred to as select gate source), and a select transistor 212 (e.g., a field-effect transistor), such as one of the select transistors $212_0$ to $212_M$ (e.g., that may each be a drain select transistor, commonly referred to as select gate drain). Select transistors $210_0$ to $210_M$ may be commonly connected to a select line 214, such as a source select line, and select transistors $212_0$ to $212_M$ may be commonly connected to a select line 215, such as a drain select line. In a particular embodiment, a drain select line may be coupled to the drain select transistors of an entire subblock (and each subblock may have its own drain select line) while a source select line may be coupled to the source select transistors of an entire block (and each block may have its own source select line).

A source of each select transistor 210 may be connected to common source 216. The drain of each select transistor 210 may be connected to a memory cell $208_0$ of the corresponding NAND string 206. For example, the drain of select transistor $210_0$ may be connected to memory cell $208_0$ of the corresponding NAND string $206o$. Therefore, each select transistor 210 may be configured to selectively couple a corresponding NAND string 206 to common source 216. A control gate of each select transistor 210 may be connected to select line 214.

The drain of each select transistor 212 may be connected to the bitline 204 for the corresponding NAND string 206. For example, the drain of select transistor $212_0$ may be connected to the bitline $204_0$ for the corresponding NAND string $206o$. The source of each select transistor 212 may be connected to a memory cell of the corresponding NAND string 206. For example, the source of select transistor $212_0$ may be connected to memory cell $208_N$ of the corresponding NAND string $206_0$. Therefore, each select transistor 212 may be configured to selectively connect a corresponding NAND string 206 to a corresponding bitline 204. A control gate of each select transistor 212 may be connected to select line 215.

The memory array in FIG. 2 may be a quasi-two-dimensional memory array and may have a generally planar structure, e.g., where the common source 216, NAND strings 206 and bitlines 204 extend in substantially parallel planes. Alternatively, the memory array in FIG. 2 may be a three-dimensional memory array, e.g., where NAND strings 206 may extend substantially perpendicular to a plane containing the common source 216 and to a plane containing the bitlines 204 (that may be substantially parallel to the plane containing the common source 216).

Typical construction of memory cells 208 includes a data-storage structure 234 (e.g., a floating gate, charge trap, etc.) that maintains a data state of the cell (e.g., through changes in threshold voltage), and a control gate 236. In some cases, memory cells 208 may further have a defined source 230 and a defined drain 232. Memory cells 208 have their control gates 236 connected to (and in some cases form) a wordline 202.

A column of the memory cells 208 is one or more NAND strings 206 selectively connected to a given bitline 204. A row of the memory cells 208 are memory cells commonly connected to a given wordline 202. A row of memory cells 208 may (but need not) include all memory cells 208 commonly connected to a given wordline 202. Rows of memory cells 208 may often be divided into one or more groups of physical pages of memory cells 208, and physical pages of memory cells 208 often include every other memory cell 208 commonly connected to a given wordline 202. For example, memory cells 208 commonly connected to wordline $202_N$ and selectively connected to even bitlines 204 (e.g., bitlines $204_0$, $204_2$, $204_4$, etc.) may be one physical page of memory cells 208 (e.g., even memory cells) while memory cells 208 commonly connected to wordline $202_N$ and selectively connected to odd bitlines 204 (e.g., bitlines $204_1$, $204_3$, $204_5$, etc.) may be another physical page of memory cells 208 (e.g., odd memory cells). Although bitlines $204_3$-$204_5$ are not expressly depicted in FIG. 2, it is apparent from the figure that the bitlines 204 of the array of memory cells 200 may be numbered consecutively from bitline $204_0$ to bitline $204_M$. Other groupings of memory cells 208 commonly connected to a given wordline 202 may also define a physical page of memory cells 208. For certain memory devices, all memory cells commonly connected to a given wordline may be deemed a physical page. For particular memory devices, all memory cells of a particular subblock commonly connected to a given wordline may be deemed a physical page. For example, memory cells that are coupled to a particular wordline in a subblock may comprise a first physical page, memory cells that are coupled to the particular wordline in a second subblock may comprise a second physical page, and so on. A bit from each memory cell of a physical page may be deemed a logical page. Thus, a single physical page may store multiple logical pages (e.g., a TLC scheme may store three logical pages in a single physical page).

In sensing (e.g., reading) a data state of a selected (e.g., target) memory cell, the memory cell is selectively activated in response to a particular voltage level applied to its control gate while current paths from the memory cell to the bitline and to the source are established, thus permitting current flow, or lack thereof, between the bitline and the source to indicate whether the memory cell has been activated in response to the particular voltage level applied to its control gate. For example, for a sensing operation of selected memory cell $208_{x+1}$ of NAND string $206_0$, a sense voltage (e.g., a read voltage or a verify voltage) may be applied to the control gate of memory cell $208_{x+1}$ while voltage levels (e.g., one or more pass voltages) are applied to the control gates of memory cells $208_0$ to $208_x$ and $208_{x+2}$ to $208_N$ of NAND string $206_0$ sufficient to activate those memory cells regardless of their data states, and while voltage levels are applied to the control gates of select transistors $210_0$ and $212_0$ sufficient to activate those transistors. A sense operation that determines whether the memory cell $208_{x+1}$ is activated in response to one or sense voltages may indicate one or more bits of the data state stored in that memory cell. In various embodiments, each memory cell 208 can be programmed according to an SLC, MLC, TLC, QLC, PLC, or other encoding scheme. Each cell's threshold voltage (Vt) is indicative of the data that is stored in the cell.

Although various embodiments have been described with respect to a particular type of memory array (e.g., a NAND flash memory array), the teachings of the various embodiments may be equally applicable to any type of memory arrays (e.g., NOR arrays, etc.), including those recited herein or similar memory arrays.

Figure 3:
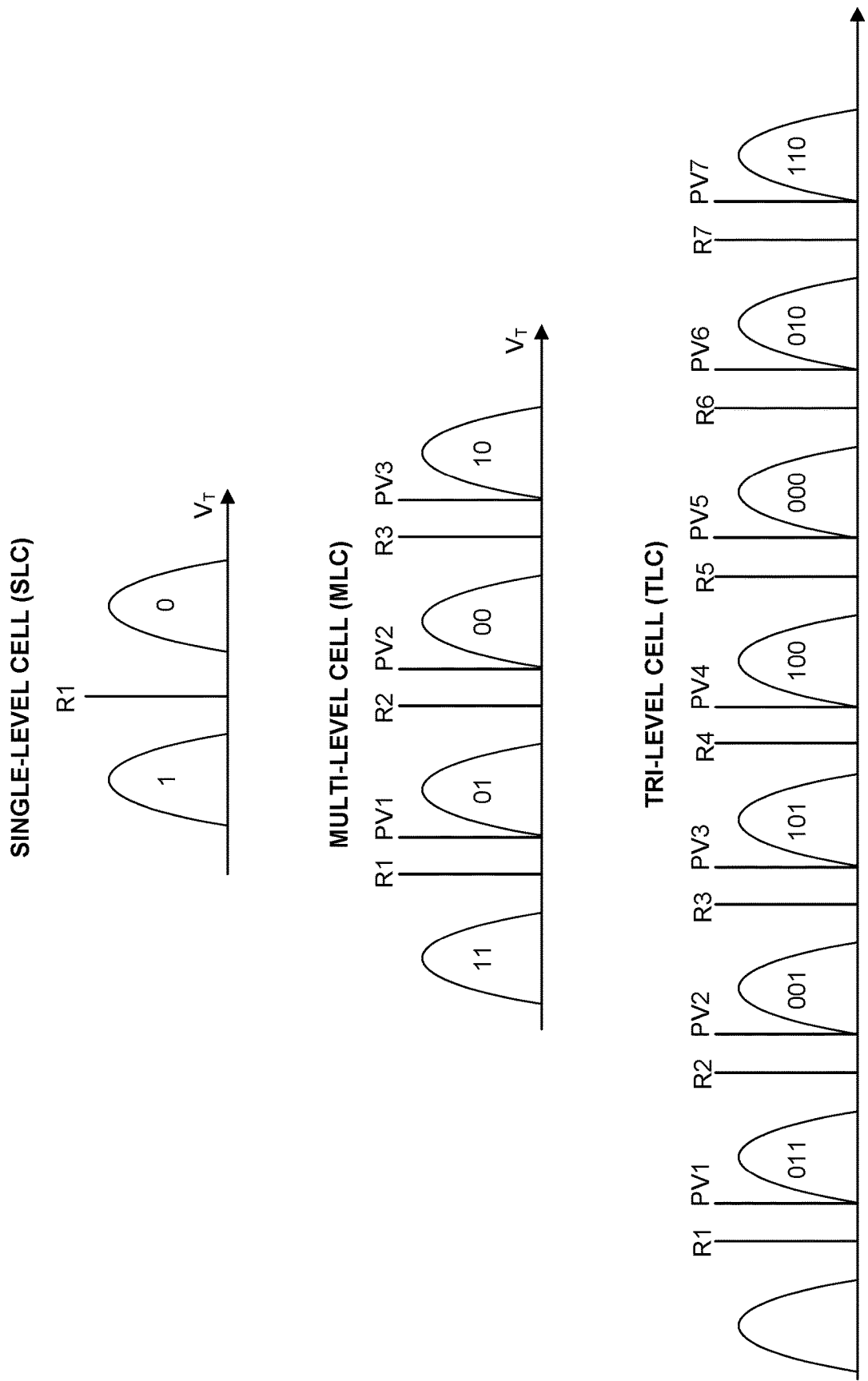
FIG. 3 illustrates example encodings of bits within NAND flash memory cells in accordance with certain embodiments.

FIG. 3 illustrates example encodings of bits within NAND flash memory cells 208 in accordance with certain embodiments. In the embodiment depicted, each elliptical region represents a range of threshold voltages that correspond to the value encoded within the cell. For example, in the SLC encoding scheme, lower threshold voltages correspond to the bit value 1 and higher threshold voltages correspond to the bit value 0. As another example, in the MLC encoding scheme, the lowest range of threshold voltages corresponds to "11", the next highest range of threshold voltages corresponds to "01", the next highest range of threshold voltages corresponds to "00", and the highest range of threshold voltages correspond to "10." Similarly, for the TLC encoding scheme (or other encoding schemes not shown), various ranges of threshold voltages correspond to various values of the bits encoded within each cell.

A program level may refer to one of the depicted elliptical regions. In other words, a program level may correspond to one of the bit encodings used in the encoding scheme. In general, if a cell is to store the value represented by the lowest voltage region, the cell does not need to be programmed (since in its erased state it already has a threshold voltage in the lowest voltage region). Accordingly, as used herein, the next lowest region (e.g., "01" of the MLC scheme or "011" of the TLC scheme) will be referred to as the first program level, the next region (e.g., "00" of the MLC scheme or "001" of the TLC scheme) will be referred to as the second program level, and so on. Under this terminology, the MLC scheme has three program levels, the TLC scheme has seven program levels, the QLC scheme has fifteen program levels, and the PLC scheme has thirty one program levels. When data (e.g., one or more pages) is written to memory 116, a plurality of the cells may be programmed to a first program level, a plurality of the cells may be programmed to a second program level, and so on.

The various R voltage values depicted in FIG. 3 (e.g., R1, R2, R3, . . . ) represent read voltages that may be applied to a wordline when the values of cells coupled to that wordline are being read. When a particular read voltage is applied, sense circuitry may determine whether the threshold value of a cell is greater than or less than the read voltage based on a voltage or current sensed by the sense circuitry via the bitline of the cell. Although not shown in FIG. 3, a QLC encoding scheme may utilize a similar scheme where fifteen read voltages may be used to resolve the values of four bits within each cell, where R1<R2<R3< . . . <R15 and a PLC encoding scheme may utilize a similar scheme where thirty one read voltages may be used to resolve the values of five bits within each cell, where R1<R2<R3< . . . <R31.

The various program verify voltages (PV1-PV3 in the MLC encoding scheme and PV1-PV7 in the TLC encoding scheme) depicted represent program verify voltages that may be applied to a cell during programming of the cell (e.g., during a program verify operation) to determine whether the threshold voltage of the cell has reached its desired level. For example, in the MLC encoding scheme, if the cell is to be programmed to "01" (i.e., program level 1), then PV1 may be applied to the cell during a verify procedure and if sensing circuitry determines that the threshold voltage of the cell is greater than PV1, then the cell is considered to have passed programming. If the threshold voltage of the cell is less than PV1, the cell is considered to not have passed programming and the storage device 106 may attempt to raise the threshold voltage of the cell or may allow the cell to fail and may later attempt error correction on the cell. As another example, if the cell is to be programmed to "00" (i.e., program level 2), then PV2 may be applied to the cell during a verify procedure and if sensing circuitry determines that the threshold voltage of the cell is greater than PV2, then the cell is considered to have passed programming. Similarly, if the cell is to be programmed to "10" (i.e., program level 3), then PV3 may be applied to the cell during a verify procedure. Any suitable program verify voltages may be used for any of the encoding schemes. In particular embodiments and as depicted, the program verify voltage may be set to a value that is at or near the beginning of the corresponding threshold voltage range. In various embodiments, there may be some margin between a program verify voltage and a corresponding read level voltage to allow for slight threshold voltage droopage (e.g., via read disturb) over time and to improve sensing accuracy. For example, the figure depicts a margin between R1 and PV1, a margin between R2 and PV2, and so on.

In particular embodiments, cells may be programmed one or more pages (e.g., logical pages) at a time, where a page is stored in a group of cells (e.g., a physical page) that are coupled to the same wordline. For example, the group of cells that is programmed may be identified by a particular wordline and a particular subblock. The group of cells may store one page of data (if the cells are encoded according to an SLC scheme) or multiple pages of data (if the cells are encoded according to an MLC, TLC, QLC, PLC, or other multi-level encoding scheme).

In various embodiments, a cell that is encoded to store multiple bits may form a part of multiple different pages, with each bit of the cell corresponding to a distinct page. For example, for a cell that is encoded with two bits (i.e., using an MLC encoding scheme), one bit may correspond to an Upper Page (UP) and the other bit may correspond to a Lower Page (LP). As another example, for a cell that is encoded with three bits (i.e., using a TLC encoding scheme), one bit may correspond to an LP, one bit may correspond to a UP, and the other bit may correspond to an Extra Page (XP). As yet another example, for a cell that is encoded with four bits (i.e., using a QLC encoding scheme), one bit may correspond to an LP, another bit may correspond to a UP, another bit may correspond to an XP, and the final bit may correspond to a Top Page (TP). Each page (e.g., LP, UP, XP, or TP) may comprise an aggregation of corresponding bits stored by a plurality of different cells of a wordline (e.g., a physical page). For example, referring to the encoding shown in FIG. 3, all of the rightmost bits of a plurality of cells encoded using a TLC scheme may form an LP, all of the middle bits of the plurality of cells may form a UP, and all of the leftmost bits of the plurality of cells may form an XP.

A programming sequence for a group of cells may comprise programming all of the intended pages into the group of cells. A programming sequence may include one or more programming passes. A programming pass (which may comprise one or more programming loops) may encode one or more pages. A programming pass may comprise the application of one or more effective program voltages to cells to be programmed followed by the application of one or more verify voltages to these cells in order to determine which cells have finished programming (subsequent programming passes generally will not apply an effective program voltage and/or a verify voltage to the cells that have finished programming). In some embodiments, one or more loops of a programming pass may comprise the application of one or more effective program voltages without the application of one or more verify voltages. The application of an effective program voltage to a cell may include changing the voltage difference between a control gate and a channel of the cell in order to change the threshold voltage of the cell. Thus, the voltage of a wordline (coupled to the control gate of the target cell) and/or a channel of the cell may be set in order to effectuate application of an effective program voltage. As a "program voltage" is commonly used to refer to a voltage applied to a wordline, the term "effective program voltage" is used herein to refer to the voltage difference between a control gate and channel of a cell (which in instances where the channel is held at 0 V will be synonymous with program voltage). Reference herein to a start program voltage may refer to either a program voltage or an effective program voltage.

As mentioned above, a programming pass may program one or more pages. For example, when the cells of a wordline are encoded using an MLC scheme, both pages (the LP and the UP) may be programmed during a single programming pass by setting the voltage levels of the cells to the desired program level (e.g., within one of the four voltage ranges depicted for the MLC scheme in FIG. 3). Alternatively, an LP could be programmed in a first pass and a UP could be programmed in a second pass. For example, during the first pass, first bits of the cells (where the first bits of the cells collectively form the LP) may be programmed to a binary state based on the desired value of each bit. For example, referring to the MLC scheme depicted in FIG. 3, if the rightmost bits of the cells form the LP, and a particular rightmost bit is to be programmed to a '0' value, the Vt of the cell may be programmed to a value that is slightly greater than PV2 in the first programming pass (or at least a portion of the way to PV2 so as to be distinguished from cells that are left in a low voltage erased state). If a particular rightmost bit is to be stored as a '1' value, it may be left at a low voltage level. During the second pass, second bits of the same cells (where the second bits of the cells collectively form the UP) are programmed, resulting in the Vt of the cells being changed to their desired Vt (e.g., within one of the four voltage ranges depicted for the MLC scheme in FIG. 3), thus storing values for the UP and the LP. As other examples, when the cells of a wordline are encoded using a TLC scheme or a QLC scheme, all pages may be programmed during a single programming pass by setting the voltage levels of the cells to the desired program level, or one or more of the pages may be programmed during a first pass and the remaining pages programmed during a second pass (or the remaining pages may be programmed using multiple additional passes). For example, in a TLC scheme, a first pass may encode an LP and a second pass may encode the UP and the XP. As another example, in a QLC scheme, a first pass may encode an LP and a UP and a second pass may encode the XP and the TP or a first pass may encode the LP and a second pass may encode the UP, XP, and TP.

In particular embodiments, a logical page of data (which may correspond to a page of data referred to by a computing host such as CPU 102) may correspond to an LP, UP, XP, TP, or other page of memory stored in cells that are encoded with multiple bits. Accordingly, two logical pages of data may correspond to an LP and a UP stored in a group of cells encoded using an MLC scheme, three logical pages of data may correspond to an LP, UP, and XP stored in a group of cells encoded using a TLC scheme, four logical pages of data may correspond to an LP, UP, XP, and TP stored in a group of cells encoded using a QLC scheme, and so on. Thus, when a computing host writes to storage device 106, if multiple pages are to be programmed in a single pass, multiple logical pages from the computing host may be aggregated and programmed in the pass. For example, in memory encoded using a TLC scheme, when the LP and UP are programmed in a single pass, two logical pages of data may be aggregated (where one logical page is stored in the LP and one logical page is stored in the UP).

Figure 4:
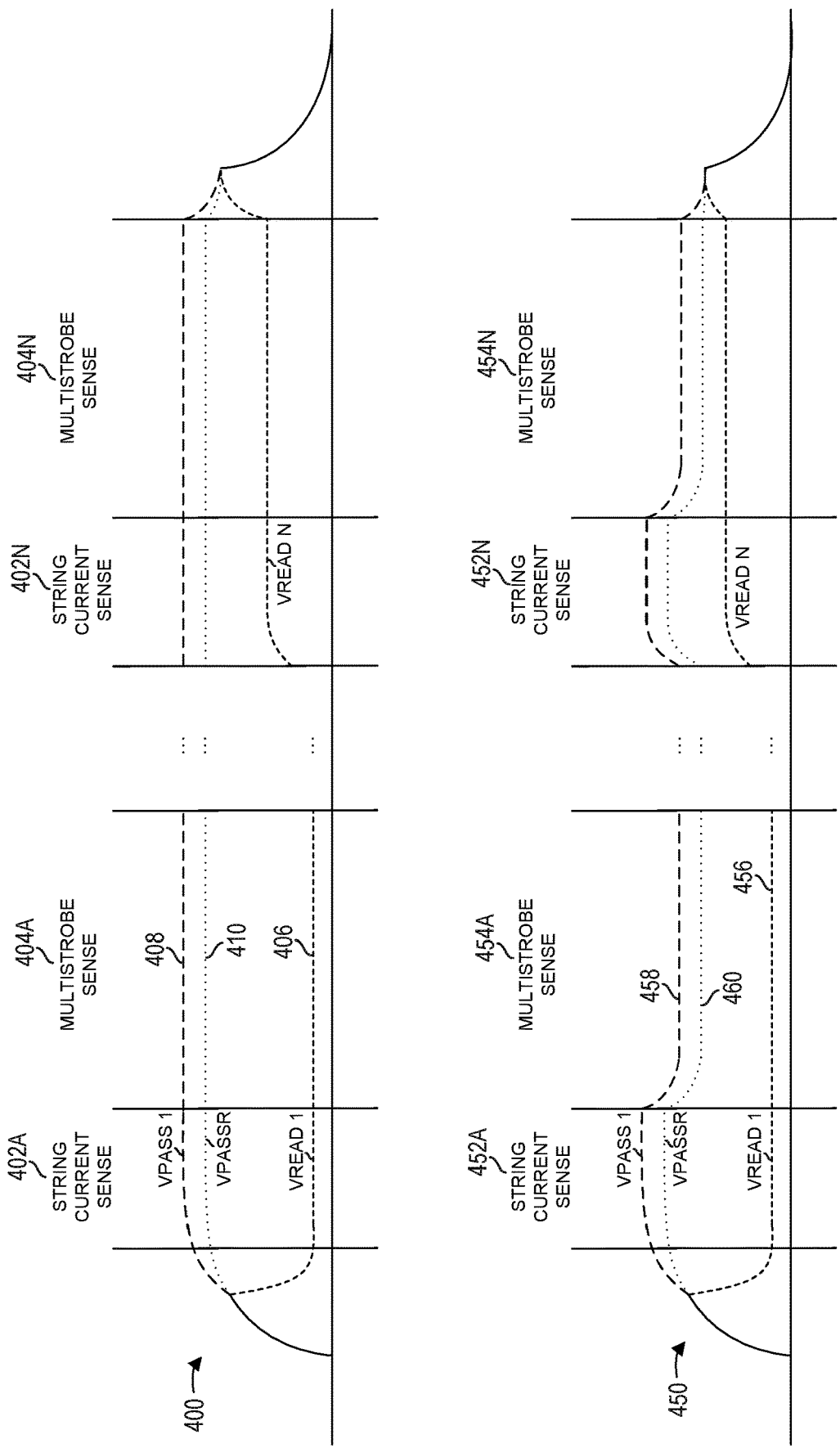
FIG. 4 illustrates wordline read voltages applied during example multistrobe read operations in accordance with certain embodiments.

FIG. 4 illustrates wordline read voltages applied during example multistrobe read operations in accordance with certain embodiments. FIG. 4 depicts, for the first read operation 400, a voltage waveform 406 for a selected wordline (i.e., the wordline coupled to the memory cells that are being read during the read operation), a voltage waveform 408 for wordlines that are directly adjacent to the selected wordline (e.g., the two wordlines that are neighbors to the selected wordline), and a voltage waveform 410 for the other wordlines of the memory array that is the subject of the read operation 400. FIG. 4 depicts corresponding waveforms 456, 458, and 460 for the read operation 450.

Read operation 400 includes a string current sense phase 402A, followed by a multistrobe sense phase 404A, followed by any suitable number of string current and multistrobe sense phases 402 and 404, and a final string current sense phase 402N and multistrobe sense phase 404N.

Read operations 400 and 450 depict memory reads wherein senses are performed for multiple different read voltages (e.g., VREAD 1, VREAD N) applied to the selected wordline. As just one example, the memory operation may illustrate an upper page read operation in a QLC memory. Although various embodiments are described with respect to memory operations including multiple string current sense phases 402 and multistrobe sense phases 404, the various embodiments described herein may also be applicable to memory operations including only a single string current sense phase 402 and a single multistrobe sense phase 404 (e.g., during a lower page read in a QLC or other memory).

During the memory operation 400, the voltages ramp up together prior to the first string current sense phase 402A and then diverge to respective levels. For example, the voltage (as depicted in voltage waveform 406) applied to the selected wordline drops to VREAD 1, the voltage (as depicted in voltage waveform 408) applied to the unselected neighbor wordlines rises to VPASS 1, and the voltage (as depicted in voltage waveform 410) applied to the other unselected wordlines rises to VPASSR. In another embodiment, the unselected neighbor wordlines may be set to the same voltage as the other unselected wordlines (e.g., to VPASSR), although raising the neighbor wordlines to a higher voltage (e.g., VPASS 1) may help reduce inter-wordline interference. VPASSR and VPASS 1 may be set high enough that they cause the memory cells coupled to the unselected wordlines to conduct (and thus do not limit current through the respective strings 206) during the string current sense phases 402 regardless of the state of the cells.

Throughout string current sense phase 402A and multistrobe sense phase 404A, the voltages of the unselected wordlines (as illustrated by waveforms 408 and 410) are held constant. These voltages may also be held constant in subsequent current sense phases 402 and multistrobe sense phases 404. During each string current sense phase 402, a different read voltage is applied to the selected wordline and the states of the cells coupled to the selected wordline are sensed. During a multistrobe sense phase (e.g., 404 or 454), additional operations may be performed to further resolve the threshold voltages of those cells. The multistrobe sense phase (e.g., 404 or 454) will be described in more detail below in connection with FIG. 5.

At the end of the string current sense phase 402 or start of the multistrobe sense phase 404, the sensed values of the cells coupled to the selected wordline are isolated from the respective bitlines and thus the voltages applied to the wordlines do not affect these isolated sensed values that are used during the multistrobe sense phase 404. In the read operation 400, the voltages (VPASS 1 and VPASSR) applied to the unselected neighbor wordlines and the other unselected wordlines respectively may stress the cells coupled to these wordlines, resulting in changes to the threshold voltages of the cells, which could lead to increased read errors or require relatively frequent refreshing.

The read operation 450 may have characteristics similar to read operation 400. However, during the multistrobe sense phase 454A, instead of maintaining the pass voltages (VPASS 1 and VPASSR) on the unselected wordlines, the voltage on these wordlines is reduced as depicted by voltage waveforms 458 and 460. For the next string current sense phase 452 (if the read operation 450 includes multiple string current sense phases), the voltages on the unselected wordlines are raised again to the same levels (e.g., VPASS 1 and VPASSR) so as not to interfere with the sensing of the cells coupled to the selected wordline.

The voltages on the unselected wordlines may be reduced during the multistrobe sense phases 454 by any suitable amount. In some embodiments, the voltages may be reduced by an amount within the range of 1 to 30 percent, although the voltages may be reduced by less than 1 percent or more than 30 percent in other embodiments. In one embodiment, the voltages are reduced by between 100 mV and 1.5 V. In other embodiments, the voltage reduction may be less than 100 mV or greater than 1.5 V. In some embodiments, the voltage or voltages on the unselected wordlines are lowered to a level or levels such that the stress on the coupled cells (and resulting read disturb) is greater during a string current sense phase 452 than during a following multistrobe sense phase 454.

In some embodiments (as depicted by waveforms 458 and 460), the voltages on the unselected neighbor wordlines and the other wordlines are reduced in lockstep (that is, each voltage is reduced by the same magnitude). In various embodiments, these voltages may be reduced by the same percentage. In other embodiments, these voltages may be reduced to the same voltage, such that the magnitude of the voltage reduction of the unselected neighbor wordlines is greater than the voltage reduction of the other unselected wordlines.

In various embodiments, all unselected wordlines are tied to the same pass voltage throughout the string current sense phases 452 and the multistrobe sense phases 454, as opposed to a higher voltage being applied to the unselected neighbor wordlines. Thus, all unselected wordlines are kept at the same pass voltage during the string current sense phases 452 and then reduced to the same value during the multistrobe sense phases 454.

In various embodiments, the reduced voltages for the unselected wordlines are the same in each multistrobe sense phase 454 of a read operation (e.g., 450) having multiple multistrobe sense phases 454. In other embodiments, the reduced voltages could be different, such that a first reduced voltage may be applied to unselected wordlines during a first multistrobe sense phase (e.g., 454A) and a different reduced voltage may be applied to the same unselected wordlines during a different multistrobe sense phase (e.g., 454N or other phase). In particular embodiments, the last multistrobe sense phase 454N could have a voltage reduction greater than the other multistrobe sense phases as the voltage on the unselected wordlines will not need to be ramped up for an additional string current sense phase 452. In one embodiment, after the last string current sense phase 452N, the read voltage on the selected wordline or the pass voltage(s) on the unselected wordlines could be ramped down to ground during the multistrobe sense phase 454N.

The voltages on the unselected wordlines may be reduced for the entire multistrobe sense phase 454, for a substantial portion thereof, or for another suitable portion thereof. In one embodiment, the voltages applied to the unselected wordlines could start ramping back up prior to the end of the multistrobe sense phase 454 so that they are at a sufficient level when the next string current sense phase 452 begins.

By reducing the voltage on the unselected wordlines, the stress on the cells coupled to these wordlines is reduced accordingly. The voltage reduction does not affect sensing operations since no actual current sensing of the memory cells is taking place during the multistrobe sense phases 454. Accordingly, the read disturb on these cells is decreased significantly relative to the stress on the cells in memory operations which do not reduce the voltage on the unselected wordlines during the multistrobe sense phases 404.

Figure 5:
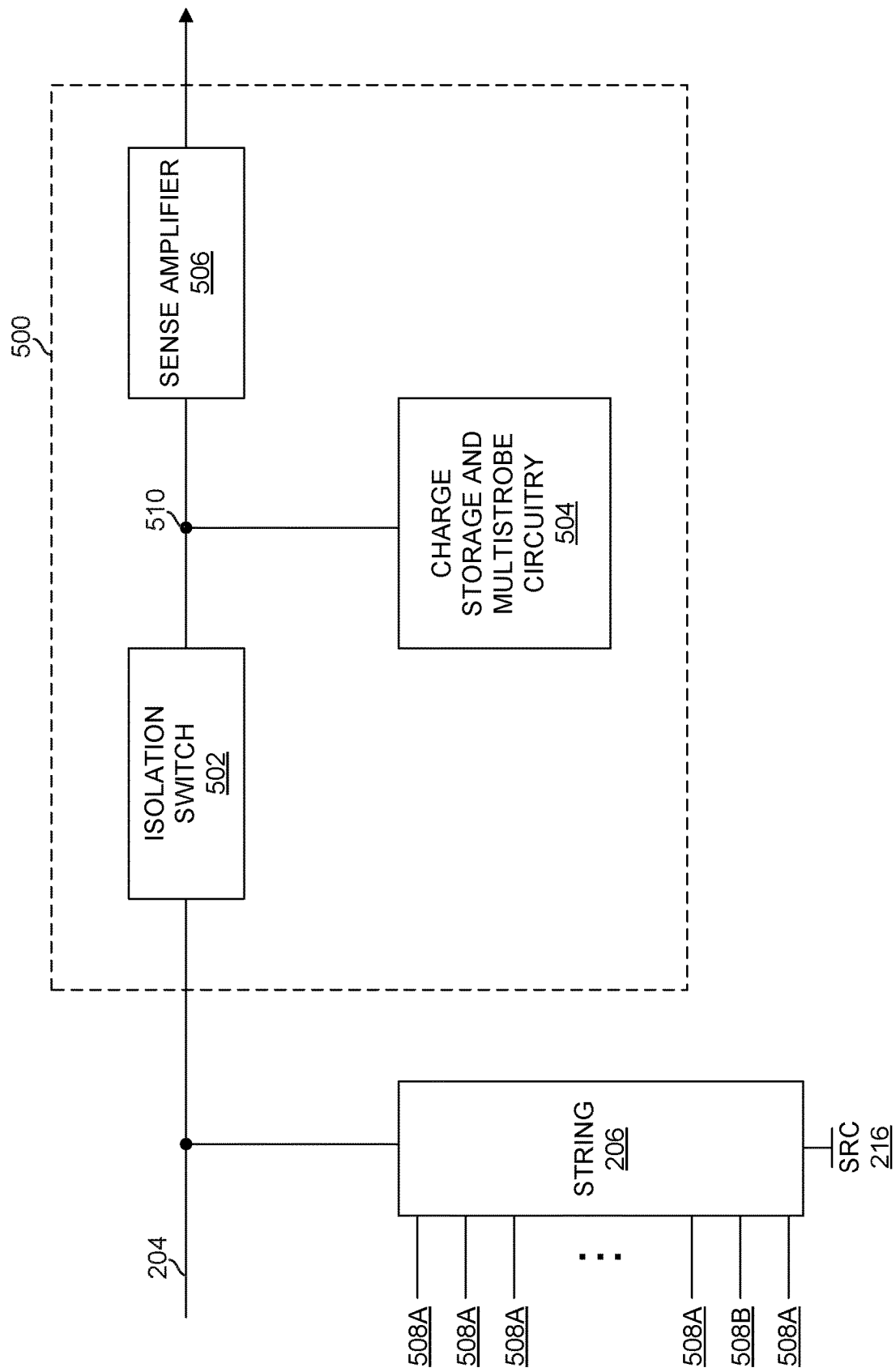
FIG. 5 illustrates a block diagram of circuitry for sensing a value of a memory cell using multistrobe sensing in accordance with certain embodiments.

FIG. 5 illustrates a block diagram of sense circuitry 500 for sensing a value of a memory cell 208 using multistrobe sensing in accordance with certain embodiments. The circuitry includes an isolation switch 502 coupled to a NAND string 206 and bitline 204. The isolation switch 502 is also coupled to a sense node 510 that is coupled to charge storage and multistrobe circuitry 504 and is also an input to a sense amplifier 506.

The sense circuitry 500 may be utilized in a memory device (e.g., 122A) to facilitate performance of a sense (e.g., read and/or verify) operation on a selected (e.g., target) memory cells in the memory device. The memory cell may be selected via a selected wordline 508B, while the other memory cells of the string 206 are driven to high voltages via unselected wordlines 508A to ensure conduction across the string 206 through these cells during the sense operation. Control signals for the sense circuitry 500 or the memory arrays 200 (e.g., signals causing the application of the wordline voltages) may be provided by any suitable controller circuitry, such as an internal controller of the memory device 122 or an internal controller of a memory chip 123. Reference herein to controller circuitry may refer to an internal controller of a memory chip 123, a controller 126, controller 118, other controller circuitry, or any suitable combination thereof.

Sense circuitry 500 is shown connected to a particular NAND string 206 by a particular bitline 204. While this discussion is directed to use of the sense circuitry 500 and wordline voltage reducing techniques with respect to a NAND string 206, other memory structures and architectures are suitable to sense the data state of a memory cell selected for sensing.

In various embodiments, charge storage and multistrobe circuitry 504 may comprise a charge storage element (e.g., a capacitor) to store a charge that is indicative of the state of the sensed memory cell. During the string current sense phase 452, the charge storage element is coupled to the string 206 via isolation switch 502. After a suitable amount of time in which the state of the target memory cell 208 is transposed onto the storage element (e.g., a charge remaining in charge storage element may represent the state of the memory cell), the isolation switch 502 may be opened to isolate the charge storage element, thus capturing the state of the memory cell. This captured state may be represented by a voltage on sense node 510, which may be compared against a reference voltage by sense amplifier 506 (e.g., during the string current sense phase 452). The output signal of the sense amplifier 506 may be representative of a logic level, such as a logic 'high' (e.g., represented by $V_{cc}$) or logic 'low' (e.g., represented by $V_{SS}$) level indicative of a sensed data state of the selected memory cell of the NAND string 206, for example. The sense amplifier output may be connected to additional circuitry of the memory device configured to respond to the sense circuitry 500 as part of a sensing operation. For example, the sense circuitry 500 may be a component of a data register and the output of the sense circuitry 500 may be provided as an input to a cache register for output of the sensed data state from the memory array.

Once the charge storage element is isolated from the string 206, the multistrobe sense phase 454 may begin. The pass voltages applied to the unselected wordlines 508A may be lowered to any suitable values to reduce stress on the memory cells coupled to these wordlines, without affecting the charge captured in the charge storage element of circuitry 504 (and the corresponding voltage developed on sense node 510). During the multistrobe sensing phase 454, the circuitry 504 may cause the voltage on the sense node 510 to be level shifted and sensed after each level shift. Alternatively, a reference voltage supplied to the sense amplifier 506 could be level shifted for each sense operation. The circuitry 504 may control such operations.

During the multistrobe sense phase 454, any suitable algorithms may be performed. For example, automatic read calibration or soft bit read may be performed. Automatic read calibration may be used to calculate the optimal location of the read voltage levels based on the current life condition of a block of memory. Automatic read calibration may analyze the current distribution placement of a page (e.g., through the aforementioned level shifting on the cell values captured during a string current sense phase 452), generate histograms, and interpolate the read voltage level to achieve optimal bit error rate performance. The calibrated read voltage levels can be used for subsequent read operations to achieve improved bit error rate on wordlines that share the same life cycle and conditions of the previously calibrated wordline.

Soft bit read is another example of an algorithm that may be performed during the multistrobe sense phase 454. In this case, the aforementioned level shifting on the cell values captured during a string current sense phase 452 is used to more finely resolve the threshold voltage distribution of the cells and, through appropriate encoding, output additional information about the probability of a given bit being 1 or 0. This additional information can be used by the ECC engine to enhance its correction capability.

Figure 6:
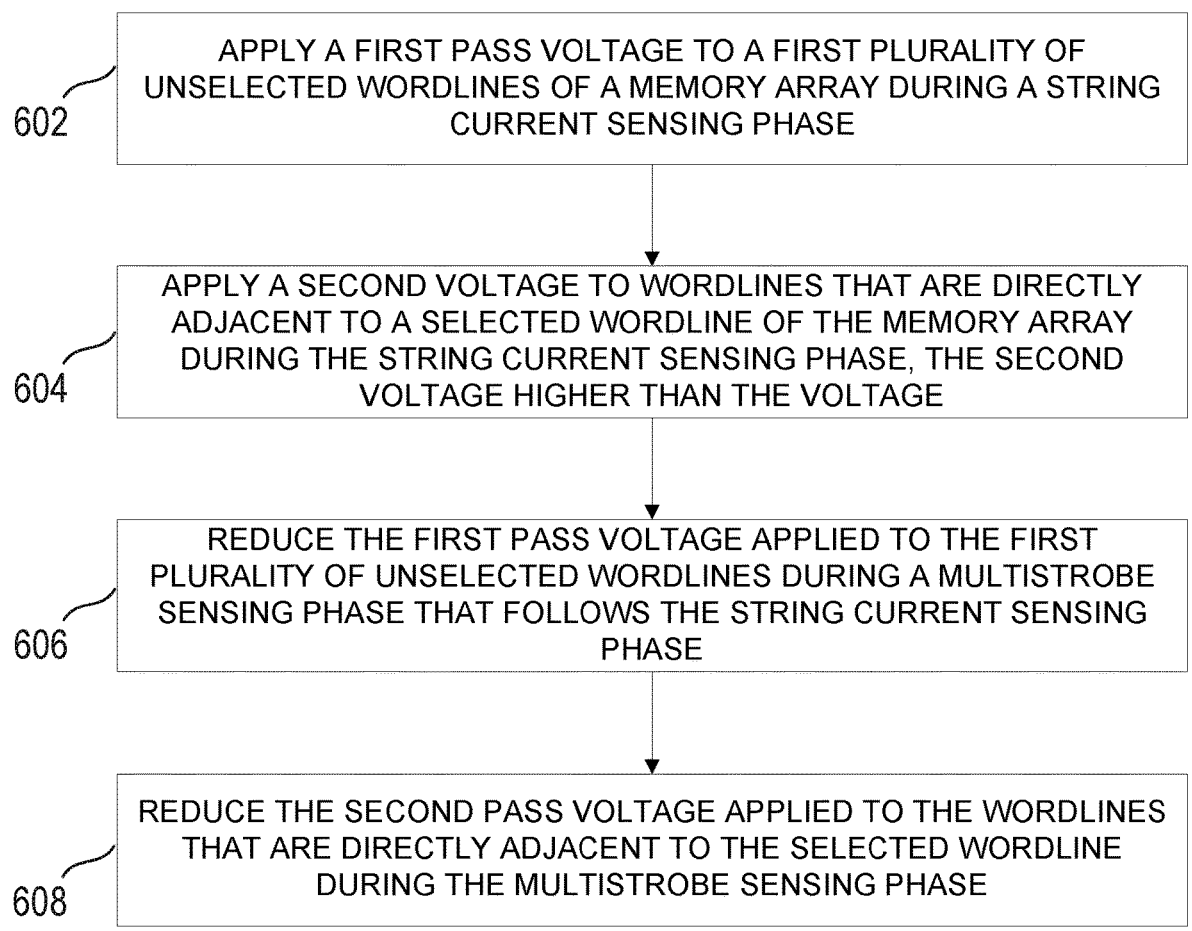
FIG. 6 illustrates a flow for reducing string current reduction during multistrobe sensing in accordance with certain embodiments.

FIG. 6 illustrates a flow for reducing string current reduction during multistrobe sensing in accordance with certain embodiments. At 602, a first pass voltage is applied to a first plurality of unselected wordlines of a memory array during a string current sensing phase. At 604, the first pass voltage applied to the first plurality of unselected wordlines is reduced during a multistrobe sensing phase that follows the string current sensing phase. At 606, a second pass voltage is applied to wordlines that are directly adjacent to a selected wordline of the memory array during the string current sensing phase, the second voltage higher than the first pass voltage. At 608, the second pass voltage applied to the wordlines that are directly adjacent to the selected wordline is reduced during the multistrobe sensing phase.

The flows described in FIGS. 4 and 6 are merely representative of operations that may occur in particular embodiments. Operations may be performed in any suitable order without departing from the scope of particular embodiments. In other embodiments, additional operations may be performed in the flow. Some of the operations illustrated in these FIGs. may be repeated, combined, modified, or deleted where appropriate. A design may go through various stages, from creation to simulation to fabrication. Data representing a design may represent the design in a number of manners. First, as is useful in simulations, the hardware may be represented using a hardware description language (HDL) or another functional description language. Additionally, a circuit level model with logic and/or transistor gates may be produced at some stages of the design process. Furthermore, most designs, at some stage, reach a level of data representing the physical placement of various devices in the hardware model. In the case where conventional semiconductor fabrication techniques are used, the data representing the hardware model may be the data specifying the presence or absence of various features on different mask layers for masks used to produce the integrated circuit. In some implementations, such data may be stored in a database file format such as Graphic Data System II (GDS II), Open Artwork System Interchange Standard (OASIS), or similar format.

In some implementations, software based hardware models, and HDL and other functional description language objects can include register transfer language (RTL) files, among other examples. Such objects can be machine-parsable such that a design tool can accept the HDL object (or model), parse the HDL object for attributes of the described hardware, and determine a physical circuit and/or on-chip layout from the object. The output of the design tool can be used to manufacture the physical device. For instance, a design tool can determine configurations of various hardware and/or firmware elements from the HDL object, such as bus widths, registers (including sizes and types), memory blocks, physical link paths, fabric topologies, among other attributes that would be implemented in order to realize the system modeled in the HDL object. Design tools can include tools for determining the topology and fabric configurations of system on chip (SoC) and other hardware device. In some instances, the HDL object can be used as the basis for developing models and design files that can be used by manufacturing equipment to manufacture the described hardware. Indeed, an HDL object itself can be provided as an input to manufacturing system software to cause the described hardware.

In any representation of the design, the data may be stored in any form of a machine readable medium. A memory or a magnetic or optical storage such as a disk may be the machine readable medium to store information transmitted via optical or electrical wave modulated or otherwise generated to transmit such information. When an electrical carrier wave indicating or carrying the code or design is transmitted, to the extent that copying, buffering, or retransmission of the electrical signal is performed, a new copy is made. Thus, a communication provider or a network provider may store on a tangible, machine-readable medium, at least temporarily, an article, such as information encoded into a carrier wave, embodying techniques of embodiments of the present disclosure.

In various embodiments, a medium storing a representation of the design may be provided to a manufacturing system (e.g., a semiconductor manufacturing system capable of manufacturing an integrated circuit and/or related components). The design representation may instruct the system to manufacture a device capable of performing any combination of the functions described above. For example, the design representation may instruct the system regarding which components to manufacture, how the components should be coupled together, where the components should be placed on the device, and/or regarding other suitable specifications regarding the device to be manufactured.

A module as used herein or as depicted in the FIGs. refers to any combination of hardware, software, and/or firmware. As an example, a module includes hardware, such as a micro-controller, associated with a non-transitory medium to store code adapted to be executed by the micro-controller. Therefore, reference to a module, in one embodiment, refers to the hardware, which is specifically configured to recognize and/or execute the code to be held on a non-transitory medium. Furthermore, in another embodiment, use of a module refers to the non-transitory medium including the code, which is specifically adapted to be executed by the microcontroller to perform predetermined operations. And as can be inferred, in yet another embodiment, the term module (in this example) may refer to the combination of the microcontroller and the non-transitory medium. Often module boundaries that are illustrated as separate commonly vary and potentially overlap. For example, a first and a second module may share hardware, software, firmware, or a combination thereof, while potentially retaining some independent hardware, software, or firmware. In one embodiment, use of the term logic includes hardware, such as transistors, registers, or other hardware, such as programmable logic devices.

Logic may be used to implement any of the flows described or functionality of the various components such as CPU 102, external I/O controller 104, I/O devices 105, storage device 106, system memory device 107, subcomponents of any of these, or other entity, system, or component described herein. "Logic" may refer to hardware, firmware, software and/or combinations of each to perform one or more functions. In various embodiments, logic may include a microprocessor or other processing element operable to execute software instructions, discrete logic such as an application specific integrated circuit (ASIC), a programmed logic device such as a field programmable gate array (FPGA), a storage device containing instructions, combinations of logic devices (e.g., as would be found on a printed circuit board), or other suitable hardware and/or software. Logic may include one or more gates or other circuit components. In some embodiments, logic may also be fully embodied as software. Software may be embodied as a software package, code, instructions, instruction sets and/or data recorded on non-transitory computer readable storage medium. Firmware may be embodied as code, instructions or instruction sets and/or data that are hard-coded (e.g., nonvolatile) in storage devices.

Use of the phrase 'to' or 'configured to,' in one embodiment, refers to arranging, putting together, manufacturing, offering to sell, importing, and/or designing an apparatus, hardware, logic, or element to perform a designated or determined task. In this example, an apparatus or element thereof that is not operating is still 'configured to' perform a designated task if it is designed, coupled, and/or interconnected to perform said designated task. As a purely illustrative example, a logic gate may provide a 0 or a 1 during operation. But a logic gate 'configured to' provide an enable signal to a clock does not include every potential logic gate that may provide a 1 or 0. Instead, the logic gate is one coupled in some manner that during operation the 1 or 0 output is to enable the clock. Note once again that use of the term 'configured to' does not require operation, but instead focus on the latent state of an apparatus, hardware, and/or element, where in the latent state the apparatus, hardware, and/or element is designed to perform a particular task when the apparatus, hardware, and/or element is operating.

Furthermore, use of the phrases 'capable of/to,' and or 'operable to,' in one embodiment, refers to some apparatus, logic, hardware, and/or element designed in such a way to enable use of the apparatus, logic, hardware, and/or element in a specified manner. Note as above that use of to, capable to, or operable to, in one embodiment, refers to the latent state of an apparatus, logic, hardware, and/or element, where the apparatus, logic, hardware, and/or element is not operating but is designed in such a manner to enable use of an apparatus in a specified manner.

A value, as used herein, includes any known representation of a number, a state, a logical state, or a binary logical state. Often, the use of logic levels, logic values, or logical values is also referred to as 1's and 0's, which simply represents binary logic states. For example, a 1 refers to a high logic level and 0 refers to a low logic level. In one embodiment, a storage cell, such as a transistor or flash cell, may be capable of holding a single logical value or multiple logical values. However, other representations of values in computer systems have been used. For example, the decimal number ten may also be represented as a binary value of 1010 and a hexadecimal letter A. Therefore, a value includes any representation of information capable of being held in a computer system.

Moreover, states may be represented by values or portions of values. As an example, a first value, such as a logical one, may represent a default or initial state, while a second value, such as a logical zero, may represent a non-default state. In addition, the terms reset and set, in one embodiment, refer to a default and an updated value or state, respectively. For example, a default value potentially includes a high logical value, i.e. reset, while an updated value potentially includes a low logical value, i.e. set. Note that any combination of values may be utilized to represent any number of states.

The embodiments of methods, hardware, software, firmware or code set forth above may be implemented via instructions or code stored on a machine-accessible, machine readable, computer accessible, or computer readable medium which are executable by a processing element. A machine-accessible/readable medium includes any mechanism that provides (i.e., stores and/or transmits) information in a form readable by a machine, such as a computer or electronic system. For example, a machine-accessible medium includes random-access memory (RAM), such as static RAM (SRAM) or dynamic RAM (DRAM); ROM; magnetic or optical storage medium; flash storage devices; electrical storage devices; optical storage devices; acoustical storage devices; other form of storage devices for holding information received from transitory (propagated) signals (e.g., carrier waves, infrared signals, digital signals); etc., which are to be distinguished from the non-transitory mediums that may receive information there from.

Instructions used to program logic to perform embodiments of the disclosure may be stored within a memory in the system, such as DRAM, cache, flash memory, or other storage. Furthermore, the instructions can be distributed via a network or by way of other computer readable media. Thus a machine-readable medium may include any mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage used in the transmission of information over the Internet via electrical, optical, acoustical or other forms of propagated signals (e.g., carrier waves, infrared signals, digital signals, etc.). Accordingly, the computer-readable medium includes any type of tangible machine-readable medium suitable for storing or transmitting electronic instructions or information in a form readable by a machine (e.g., a computer).

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the foregoing specification, a detailed description has been given with reference to specific exemplary embodiments. It will, however, be evident that various modifications and changes may be made thereto without departing from the broader spirit and scope of the disclosure as set forth in the appended claims. The specification and drawings are, accordingly, to be regarded in an illustrative sense rather than a restrictive sense. Furthermore, the foregoing use of embodiment and other exemplarily language does not necessarily refer to the same embodiment or the same example, but may refer to different and distinct embodiments, as well as potentially the same embodiment.

Example 1 may include a system comprising a memory array; and controller circuitry to apply a first pass voltage to a first plurality of unselected wordlines of the memory array during a string current sensing phase; and reduce the first pass voltage applied to the first plurality of unselected wordlines during a multistrobe sensing phase that follows the string current sensing phase.

Example 2 includes the subject matter of Example 1, the controller circuitry further to apply a second pass voltage to wordlines that are directly adjacent to a selected wordline of the memory array during the string current sensing phase, the second pass voltage higher than the first pass voltage; and reduce the second pass voltage applied to the wordlines that are directly adjacent to the selected wordline during the multistrobe sensing phase.

Example 3 includes the subject matter of Example 2, wherein, during the multistrobe sensing phase, the reduced first pass voltage applied to the first plurality of unselected wordlines is different from the reduced second pass voltage applied to the wordlines that are directly adjacent to the selected wordline.

Example 4 includes the subject matter of any one of Examples 1-3, the controller circuitry further to reapply the first pass voltage to the first plurality of unselected wordlines during a second string current sensing phase that follows the multistrobe sensing phase, wherein the string current sensing phase and the second string current sensing phase are part of the same read operation.

Example 5 includes the subject matter of any one of Examples 1-4, wherein the reduction in the first pass voltage applied to the first plurality of unselected wordlines is between 100 millivolts and 1.5 volts.

Example 6 includes the subject matter of any one of Examples 1-5, wherein the reduction in the first pass voltage applied to the first plurality of unselected wordlines is between 1% and 30% of the voltage.

Example 7 includes the subject matter of any one of Examples 1-6, wherein the reduction to the first pass voltage causes the amount of read disturb to a plurality of memory cells coupled to the unselected wordlines during the multistrobe sensing phase to be less than the amount of read disturb to the plurality of memory cells during the string current sensing phase.

Example 8 includes the subject matter of any one of Examples 1-7, further comprising a plurality of memory chips, wherein a first memory chip comprises the memory array and controller circuitry.

Example 9 includes the subject matter of Example 8, further comprising a memory controller to communicate with the plurality of memory chips.

Example 10 includes the subject matter of Example 9, further comprising a central processing unit to communicate read and write instructions to the memory controller.

Example 11 includes the subject matter of any one of Examples 1-10, wherein the memory array and controller circuitry are embodied within a solid state drive or a dual in-line memory module.

Example 12 may include a method comprising applying a first pass voltage to a first plurality of unselected wordlines of a memory array during a string current sensing phase; and reducing the first pass voltage applied to the first plurality of unselected wordlines during a multistrobe sensing phase that follows the string current sensing phase.

Example 13 includes the subject matter of Example 12, applying a second pass voltage to wordlines that are directly adjacent to a selected wordline of the memory array during the string current sensing phase, the second voltage higher than the first pass voltage; and reducing the second pass voltage applied to the wordlines that are directly adjacent to the selected wordline during the multistrobe sensing phase.

Example 14 includes the subject matter of Example 13, wherein, during the multistrobe sensing phase, the reduced first pass voltage applied to the first plurality of unselected wordlines is different from the reduced second pass voltage applied to the wordlines that are directly adjacent to the selected wordline.

Example 15 includes the subject matter of any one of Examples 12-14, further comprising reapplying the first pass voltage to the first plurality of unselected wordlines during a second string current sensing phase that follows the multistrobe sensing phase, wherein the string current sensing phase and the second string current sensing phase are part of the same read operation.

Example 16 includes the subject matter of any one of Examples 12-15, wherein the reduction in the first pass voltage applied to the first plurality of unselected wordlines is between 100 millivolts and 1.5 volts.

Example 17 includes the subject matter of any one of Examples 12-16, wherein the reduction in the first pass voltage applied to the first plurality of unselected wordlines is between 1% and 30% of the voltage.

Example 18 includes the subject matter of any one of Examples 12-17, wherein the reduction to the first pass voltage causes the amount of read disturb to a plurality of memory cells coupled to the unselected wordlines during the multistrobe sensing phase to be less than the amount of read disturb to the plurality of memory cells during the string current sensing phase.

Example 19 includes the subject matter of any one of Examples 12-18, wherein a first memory chip comprises the memory array and controller circuitry.

Example 20 includes the subject matter of Example 8, further comprising using a memory controller is to communicate with the plurality of memory chips.

Example 21 includes the subject matter of Example 9, further comprising using a central processing unit to communicate read and write instructions to the memory controller.

Example 22 includes the subject matter of any one of Examples 12-21, wherein the memory array and controller circuitry are embodied within a solid state drive or a dual in-line memory module.

Example 23 may include a storage device comprising a storage device controller; and a plurality of memory chips, wherein a memory chip comprises a memory array; and controller circuitry to apply a first pass voltage to a first plurality of unselected wordlines of the memory array during a string current sensing phase; and reduce the first pass voltage applied to the first plurality of unselected wordlines during a multistrobe sensing phase that follows the string current sensing phase.

Example 24 includes the subject matter of Example 23, the controller circuitry further to apply a second pass voltage to wordlines that are directly adjacent to a selected wordline of the memory array during the string current sensing phase, the second pass voltage higher than the first pass voltage; and reduce the second pass voltage applied to the wordlines that are directly adjacent to the selected wordline during the multistrobe sensing phase.

Example 25 includes the subject matter of Example 24, wherein, during the multistrobe sensing phase, the reduced first pass voltage applied to the first plurality of unselected wordlines is different from the reduced second pass voltage applied to the wordlines that are directly adjacent to the selected wordline.

Example 26 includes the subject matter of any one of Examples 23-25, the controller circuitry further to reapply the first pass voltage to the first plurality of unselected wordlines during a second string current sensing phase that follows the multistrobe sensing phase, wherein the string current sensing phase and the second string current sensing phase are part of the same read operation.

Example 27 includes the subject matter of any one of Examples 23-26, wherein the reduction in the first pass voltage applied to the first plurality of unselected wordlines is between 100 millivolts and 1.5 volts.

Example 28 includes the subject matter of any one of Examples 23-27, wherein the reduction in the first pass voltage applied to the first plurality of unselected wordlines is between 1% and 30% of the voltage.

Example 29 includes the subject matter of any one of Examples 23-28, wherein the reduction to the first pass voltage causes the amount of read disturb to a plurality of memory cells coupled to the unselected wordlines during the multistrobe sensing phase to be less than the amount of read disturb to the plurality of memory cells during the string current sensing phase.

Example 30 includes the subject matter of any one of Examples 23-29, the storage device further comprising a plurality of memory chips, wherein a first memory chip comprises the memory array and controller circuitry.

Example 31 includes the subject matter of Example 30, the storage device further comprising a memory controller to communicate with the plurality of memory chips.

Example 32 includes the subject matter of Example 31, further comprising a central processing unit of a host device to communicate read and write instructions to the memory controller.

Example 33 includes the subject matter of any one of Examples 24-32, wherein the memory array and controller circuitry are embodied within a solid state drive or a dual in-line memory module.

What is claimed is:

1. A memory device comprising:
a memory array; and
controller circuitry to:
apply a first pass voltage to a first plurality of unselected wordlines of the memory array during a string current sensing phase; and
reduce the first pass voltage applied to the first plurality of unselected wordlines during a multistrobe sensing phase that follows the string current sensing phase.

2. The memory device of claim 1, the controller circuitry further to:
apply a second pass voltage to wordlines that are directly adjacent to a selected wordline of the memory array during the string current sensing phase, the second pass voltage higher than the first pass voltage; and
reduce the second pass voltage applied to the wordlines that are directly adjacent to the selected wordline during the multistrobe sensing phase.

3. The memory device of claim 2, wherein, during the multistrobe sensing phase, the reduced first pass voltage applied to the first plurality of unselected wordlines is different from the reduced second pass voltage applied to the wordlines that are directly adjacent to the selected wordline.

4. The memory device of claim 1, the controller circuitry further to reapply the first pass voltage to the first plurality of unselected wordlines during a second string current sensing phase that follows the multistrobe sensing phase, wherein the string current sensing phase and the second string current sensing phase are part of the same read operation.

5. The memory device of claim 1, wherein the reduction in the first pass voltage applied to the first plurality of unselected wordlines is between 100 millivolts and 1.5 volts.

6. The memory device of claim 1, wherein the reduction in the first pass voltage applied to the first plurality of unselected wordlines is between 1% and 30% of the voltage.

7. The memory device of claim 1, wherein the reduction to the first pass voltage causes the amount of read disturb to a plurality of memory cells coupled to the unselected wordlines during the multistrobe sensing phase to be less than the amount of read disturb to the plurality of memory cells during the string current sensing phase.

8. The memory device of claim 1, further comprising a plurality of memory chips, wherein a first memory chip comprises the memory array and controller circuitry.

9. The memory device of claim 8, further comprising a controller to communicate with the plurality of memory chips.

10. The memory device of claim 1, wherein the memory array and controller circuitry are embodied within a solid state drive or a dual in-line memory module.

11. A method comprising:
applying a first pass voltage to a first plurality of unselected wordlines of a memory array during a string current sensing phase; and
reducing the first pass voltage applied to the first plurality of unselected wordlines during a multistrobe sensing phase that follows the string current sensing phase.

12. The method of claim 11, further comprising:
applying a second pass voltage to wordlines that are directly adjacent to a selected wordline of the memory array during the string current sensing phase, the second voltage higher than the first pass voltage; and
reducing the second pass voltage applied to the wordlines that are directly adjacent to the selected wordline during the multistrobe sensing phase.

13. The method of claim 12, wherein, during the multistrobe sensing phase, the reduced first pass voltage applied to the first plurality of unselected wordlines is different from the reduced second pass voltage applied to the wordlines that are directly adjacent to the selected wordline.

14. The method of claim 11, further comprising reapplying the voltage to the first plurality of unselected wordlines during a second string current sensing phase that follows the multistrobe sensing phase, wherein the string current sensing phase and the second string current sensing phase are part of the same read operation.

15. The method of claim 11, wherein the reduction to the first pass voltage causes the amount of read disturb to a plurality of memory cells coupled to the unselected wordlines during the multistrobe sensing phase to be less than the amount of read disturb to the plurality of memory cells during the string current sensing phase.

16. A system comprising:
a storage device controller; and
a plurality of memory chips, wherein a memory chip comprises:
a memory array; and
controller circuitry to:
apply a first pass voltage to a first plurality of unselected wordlines of the memory array during a string current sensing phase; and
reduce the first pass voltage applied to the first plurality of unselected wordlines during a multistrobe sensing phase that follows the string current sensing phase.

17. The system of claim 16, wherein the controller circuitry is to:
apply a second pass voltage to wordlines that are directly adjacent to a selected wordline of the memory array during the string current sensing phase, the second pass voltage higher than the first pass voltage; and
reduce the second pass voltage applied to the wordlines that are directly adjacent to the selected wordline during the multistrobe sensing phase.

18. The system of claim 16, the controller circuitry further to reapply the first pass voltage to the first plurality of unselected wordlines during a second string current sensing phase that follows the multistrobe sensing phase, wherein the string current sensing phase and the second string current sensing phase are part of the same read operation.

19. The system of claim 16, wherein the reduction to the first pass voltage causes the amount of read disturb to a plurality of memory cells coupled to the unselected wordlines during the multistrobe sensing phase to be less than the amount of read disturb to the plurality of memory cells during the string current sensing phase.

20. The system of claim 16, further comprising a central processing unit to communicate read and write instructions through a memory controller to the storage device controller.

* * * * *